United States Patent

Kurita et al.

[11] Patent Number: 5,762,766
[45] Date of Patent: Jun. 9, 1998

[54] METHOD FOR DEPOSITING MAGNETIC FILM ON BOTH SUBSTRATE SURFACES AND MECHANISM FOR PERFORMING SAME

[75] Inventors: Takaki Kurita; Naoki Watanabe; Naoki Yamada, all of Tokyo, Japan

[73] Assignee: Anelva Corporation, Fuchu, Japan

[21] Appl. No.: 747,834

[22] Filed: Nov. 13, 1996

[30] Foreign Application Priority Data

Nov. 20, 1995 [JP] Japan ..................... 7-326542

[51] Int. Cl.$^6$ ..................................... C23C 14/34
[52] U.S. Cl. ..................... 204/192.2; 204/192.13; 204/192.15; 204/298.03; 204/298.19; 204/298.22; 204/298.26
[58] Field of Search ............... 204/192.12, 192.13, 204/192.15, 192.2, 298.03, 298.06, 298.19, 298.2, 298.26, 298.28

[56] References Cited

U.S. PATENT DOCUMENTS

| | | | |
|---|---|---|---|
| 4,880,514 | 11/1989 | Scott et al. | 204/192.2 |
| 4,894,133 | 1/1990 | Hedgcoth | 204/298.26 X |
| 5,047,130 | 9/1991 | Akao et al. | 204/192.12 |

FOREIGN PATENT DOCUMENTS 5-334648  12/1993  Japan.

OTHER PUBLICATIONS

Anelva Disk Sputtering System C-3010 (Brochure); Aug. 1995.

Anelva In-Line Disk Sputtering System 3100 Series; (Brochure); May 1989.

*Primary Examiner*—Nam Nguyen
*Attorney, Agent, or Firm*—Burns, Doane, Swecker & Mathis, LLP

[57] ABSTRACT

A sputtering method includes depositing a magnetic thin film on both surfaces of a substrate by magnetron sputtering, wherein magnetic assemblies of magnetron cathodes form a magnetic field asymmetric to a rotation axis perpendicular to the substrate on a target, and a pair of magnet assemblies of magnetron cathodes opposing each other rotate at the same speed and in the same direction. A sputtering mechanism for depositing a magnetic thin film on both surfaces of the substrate by magnetron sputtering, includes a controller system for controlling a rotation drive unit of each magnet assembly on a pair of magnetron cathodes being held in common.

11 Claims, 10 Drawing Sheets

| | CONVENTIONAL | THIS EMBODIMENT |
|---|---|---|
| ROTATION DIRECTION OF EACH MAGNET ASSEMBLY | OPPOSITE | THE SAME |
| FLUCTUATION OF COERCIVE FORCE | +/-4.5% | +/-1.9% |
| BIAS VOLTAGE TO SUBSTRATE | -300v | -300v |
| MODULATION CHARACTERISTICS |  |  |

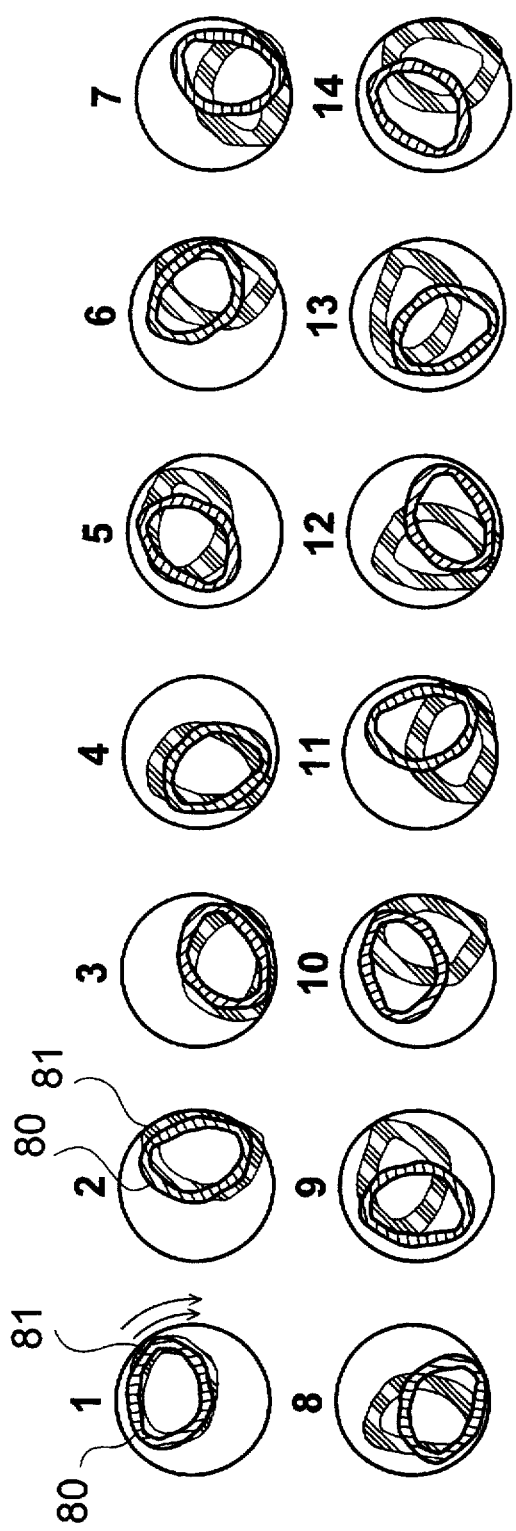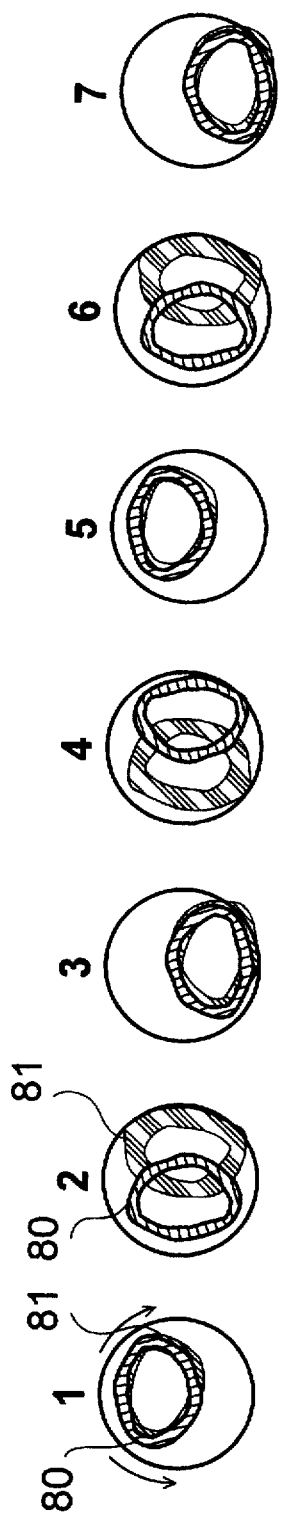
FIG. 10a
FIG. 10b

METHOD FOR DEPOSITING MAGNETIC FILM ON BOTH SUBSTRATE SURFACES AND MECHANISM FOR PERFORMING SAME

BACKGROUND OF THE INVENTION

1. Field of the Invention

The present invention relates to a sputtering method for depositing a magnetic thin film which is used in the manufacturing processes for magnetic recording medium, such as hard disks. The present invention also relates to a mechanism for performing such a sputtering method.

2. Description of the Related Art

Hard disks have been widely used as magnetic recording media in personal computer fields. Hard disks comprise a disk substrate and multi-layer stacked films including magnetic thin films, formed on both side of the substrate. Such multi-layer stacked films are formed by the following processes: First, nickel phosphide (NiP) is plated on a nonmagnetic substrate, e.g., an aluminum substrate, and the plated nickel phosphide is subjected to some surface treatments, e.g., hardening, polishing, and texture forming; on the surface-treated substrate, chromium metal or alloy films are deposited as underlying films; then, magnetic thin films, e.g., CoNiCr, CoCrPtTa, or CoCrPtTaNi, are deposited thereon; protective films, e.g., carbon films, are deposited thereon for enhancing abrasion resistance against magnetic heads; finally, lubricant oil is coated thereon.

In the above-mentioned processes, chromium metal or alloy films as underlying films, and magnetic films, such as CoNiCr films, are generally deposited by sputtering methods. Recently, for the purpose of improving magnetic recording characteristics, such films are deposited in a static opposing mode, in which a substrate is stationary while opposing a cathode during deposition, instead of being in a passage mode, in which a substrate passes by the front of a cathode during deposition.

FIG. 8 is an outlined perspective view illustrating a conventional double-sided sputtering mechanism used for the deposition of such magnetic films. A mechanism performs magnetron sputtering with a magnetron cathode 1 in a vacuum chamber (not shown in the figure). In FIG. 8, a pair of magnetron cathodes 1 stand opposite each other so as to deposit films on both sides of the substrate 2 at the same time.

Each magnetron cathode 1 comprises a target 11 and a magnet assembly 12 for establishing a line of magnetic force over the target 11. The target 11 is fixed at the front face of the magnet assembly 12 with a backing plate 13. The magnet assembly 12 comprises a central magnet 121, a peripheral magnet 122 having a different magnetic pole from the central magnet 121, and a disk-shaped yoke 123. The magnet assembly 12 is described in detail in U.S. Pat. No. 5,047,130, and is the most suitable assembly for the sputtering of magnetic films having a uniform thickness. Further, the magnetron cathode 1 connects to a power source 3 for applying an electric power required for magnetron discharge to the magnetron cathode 1.

In addition, the sputtering mechanism in FIG. 8 is provided with a gas inlet means (not shown in the figure) for introducing a sputtering gas into the space between the substrate 2 and each magnetron cathode 1. The sputtering gas is an inert gas having a high sputtering rate, for example, argon gas.

A conventional double-sided sputtering method will be explained with reference to the sputtering mechanism in FIG. 8. The substrate 2 is transferred with a transferring system (not shown in the figure) to be placed between two opposing magnetron cathodes 1. Then, a sputtering gas is introduced into the space between the substrate 2 and magnetron cathodes 1 with the gas inlet system. An electric power is applied to each magnetron cathode 1 from the respective power source 3 to generate an electric field perpendicularly crossing the magnetic field established by the magnet assembly 12. Such perpendicular crossing of the electric field and the magnetic field ionizes the sputtering gas and thus causes a magnetron discharge to be produced. The ionized sputtering gas sputters the target 11, and the sputtered particles from the target 11 travel toward the substrate 2 to be deposited on the surface of the substrate 2. A thin film is deposited on the surface of the substrate 2 by such a magnetron sputtering method. For example, when depositing a magnetic thin film comprising CoNiCr, a target comprising CoNiCr is used in the sputtering method. In the magnet assembly 12 described in the U.S. Pat. No. 5,047,130 set forth above, since magnetron discharge is locally generated over the target 11, only a part of the target 11 is sputtered. To sputter the entire surface of the target 11, each magnet assembly 12 must be rotated during the magnetron sputtering operation using a rotation drive unit 4. The rotation drive unit makes two magnet assemblies 12 rotate opposite to each other.

OBJECTS AND SUMMARY

The present invention intends to improve magnetic characteristics, and in particular, the in-plane coercive force, of a magnetic film which is deposited by a magnetron sputtering method. A hard disk requires a uniform distribution of magnetic characteristics, and in particular, the coercive force, in the circumferential direction of its recording surface. A nonuniform circumferential distribution of the coercive force causes a deterioration of its modulation characteristic or envelope which represents the output distribution in the circumferential distribution. The deterioration of the modulation characteristics is caused by a nonuniform distribution of the residual magnetism after the recorded information on the magnetic recording medium is erased. A problem arises in that the output from the recording area after erasing has a nonuniform distribution in the circumferential direction. In addition, the deterioration of the modulation characteristics will increase the error rate when information is recorded to or read from the magnetic recording medium.

It is an object of the present invention to provide a sputtering method for depositing a magnetic thin film having improved in-plane distribution of magnetic characteristics, and in particular, of the coercive force.

It is another object of the present invention to provide a sputtering mechanism for optimally performing such a sputtering method.

According to one aspect of the present invention, a pair of magnet assemblies of magnetron cathodes oppose each other and rotate at the same speed in the same direction during deposition of a magnetic thin film on both surfaces of a substrate by magnetron sputtering. Such a rotation at the same speed in the same direction enables a uniform coercive force of the magnetic thin film in the circumferential direction of the substrate.

Furthermore, according to another aspect of the present invention, the phase difference of a pair of magnet assemblies is set so that the coercive force of a magnetic thin film is uniformly distributed in the radial direction of a substrate and the magnet assemblies rotate at the same speed in the same direction. When the phase difference between the magnet assemblies is 180 degrees, the coercive force of the magnetic thin film is the most uniformly distributed in the radial direction of the substrate.

The magnet assembly of each magnetron cathode establishes a magnetic field asymmetric to the rotation axis perpendicular to the substrate.

In order to enhance the coercive force of the magnetic thin film, a bias power is preferably applied to the substrate during deposition.

The rotation speed of each magnet assembly is controlled while detecting the rotation speed and/or the phase difference of each magnet assembly so that the rotation speed of each magnet assembly does not vary or the phase difference does not shift during rotation.

According to yet another aspect of the present invention, a controller system for controlling a rotation drive unit for each magnet assembly is held in common by a pair of magnetron cathodes. The controller system comprises a pulse control driver for transmitting pulse drive signals to each rotation drive unit, a programmable controller for transmitting control signals to the pulse control driver, and a clock oscillating circuit for supplying clock pulses to each pulse control driver. Since the controller system compensates for the variation of the rotation speed and the shift of the phase difference while monitoring the rotation speed and/or the phase difference of each magnet assembly, the phase difference does not gradually shift during rotation.

In addition, the controller system further comprises a detecting unit for independently detecting the rotation speed and the phase difference of each magnet assembly.

The rotation drive system is preferably a servo motor or a stepping motor.

BRIEF DESCRIPTION OF THE DRAWINGS

FIGS. 10(a) and 10(b) are schematic diagrams illustrating the phase difference deviations in the rotation of a pair of magnet assemblies in the opposite direction and in the same direction, respectively.

DESCRIPTION OF THE PREFERRED EMBODIMENTS

Embodiments of this invention will be explained.

Figure 1:
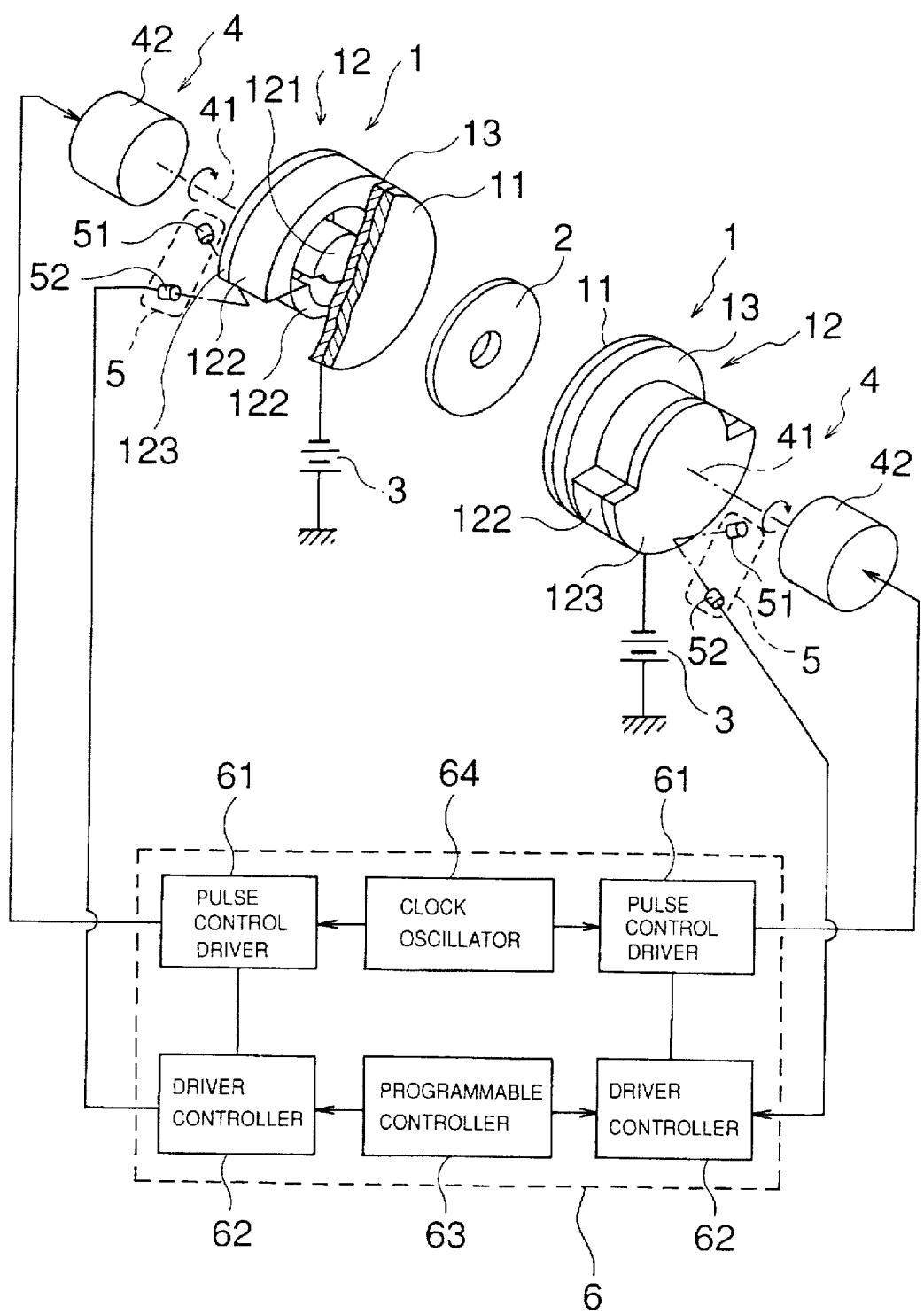
FIG. 1 is an outlined perspective view illustrating a sputtering mechanism in accordance with the present invention.

FIG. 1 is an outlined perspective view illustrating the main section of a sputtering mechanism for producing a magnetic thin film in accordance with the present invention. The sputtering mechanism for a magnetic thin film in FIG. 1 is provided with a pair of magnetron cathodes 1, which stand opposite each other in a vacuum chamber (not shown in the figure), and a gas inlet system (not shown in the figure) for introducing a sputtering gas into the space between each magnetron cathode 1 and a substrate 2. Each magnetron cathode 1 connects to a power source 3 for applying an electric power required for magnetron discharge. Further, each magnetron cathode 1 is provided with a rotation drive unit 4 to rotate a magnet assembly 12. The rotation drive unit 4 comprises a detecting unit 5 for detecting the deviation of the rotation speed of the magnet assembly, and a controller system 6 which performs feedback control to correct such deviation.

Each magnetron cathode 1 comprises a target 11 composed of a magnetic material, the magnet assembly 12 for establishing a line of magnetic force over the target 11, and a backing plate 13 to fix the target 11 in front of the magnet assembly 12. The magnet assembly 12 used in this embodiment is identical to that described in U.S Pat. No. 5,047,130. The subject matter of U.S. Pat. No. 5,047,130 is incorporated herein by reference. The magnet assembly 12 generates a magnetic field distribution asymmetric to the rotation axis 41 perpendicular to the substrate 2. In other words, the magnet assembly 12 generates an asymmetric magnetron discharge distribution over the target 11.

The magnet assembly 12 has a central magnet 121, a peripheral magnet 122 having a different magnetic pole from the central magnet 121 and surrounding the central magnet 121, and a yoke 123 for holding them. The central magnet 121 is composed of a plurality of cylindrical magnetic elements each having a fan-shaped cross-section like a slice of cake. The peripheral magnet 122 comprises a plurality of plate magnets which are connected to each other to form a closed loop.

Figure 2A:
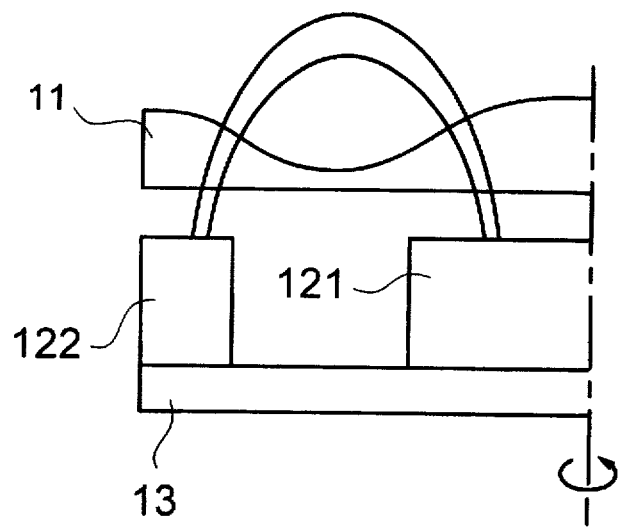
FIGS. 2(a), 2(b), and 2(c) are cross-sectional views illustrating the erosion shapes across target 11.
Figure 2B:
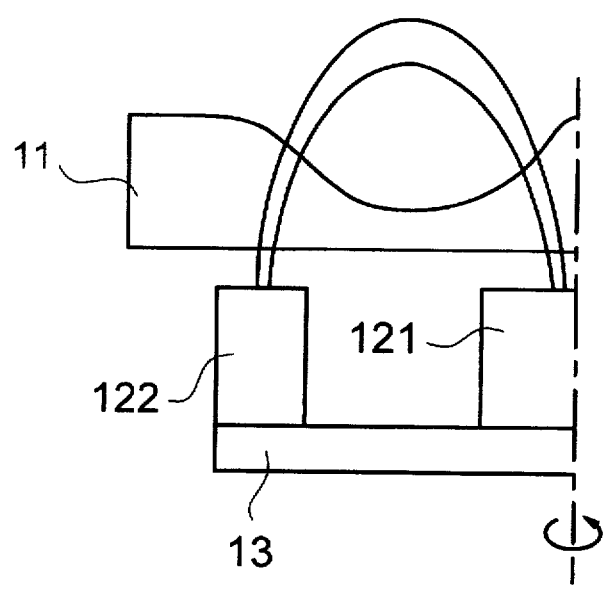
Figure 2C:
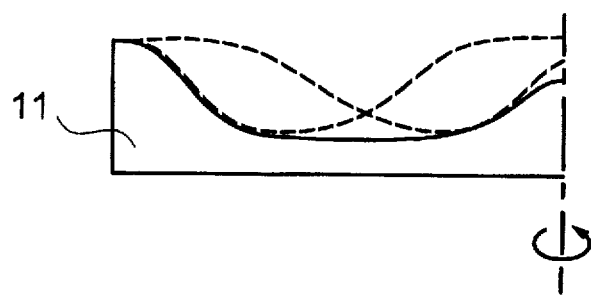

FIGS. 2(a), 2(b) and 2(c) are cross-sectional views of the erosion shapes across the target 11. FIG. 2(a) shows the line of magnetic force generated by the larger fan-shaped, cylindrical magnet elements among the central magnet 121 and the peripheral magnet 122, and the erosion shape across the target 11. FIG. 2(b) shows the line of magnetic force generated by the smaller fan-shaped, cylindrical magnet elements among the central magnet 121 and the peripheral magnet 122, and the erosion shape across the target 11. Further, FIG. 2(c) shows the erosion shape across the target 11 when the magnet assemblies 12 rotate.

The erosion shape across the target 11 depends on the arch-shaped line distribution of magnetic force generated over the target 11, in other words, the distribution of magnetron discharge. Two erosion regions on the target 11 occur far from the center in FIG. 2(a), and near the center in FIG. 2(b), respectively.

When the magnet assembly 12 rotates, the two erosion regions are combined so that a uniform-depth erosion region is extended on the target 11. Thus, the target 11 can be used more effectively, and the thickness distribution of the deposited film becomes more uniform.

The rotation drive unit 4, the detecting unit 5 and the controller system 6 in accordance with the present invention will now be explained. The rotation drive units 4 rotate their respective magnet assemblies 12 around the rotation axis 41 in order to extend the erosion region and to make the erosion depth uniform. In this embodiment, the rotation drive units 4 rotate their respective magnet assemblies 12 at the same rotation speed and in the same direction. The rotation drive unit 4 comprises the rotation axis 41 provided on the back side of the magnetron cathode 1, and a motor 42 connected to the rotation axis 41. The rotation axis 41 is a common pivot of the substrate 2 and the magnet assembly 12.

The motor 42 is a stepping motor, pulse-controlled motor, or pulse motor, which enables the rotation direction to be freely selected and the rotation speed to be freely adjusted in a range of 2 to 200 RPM. Such a stepping motor is commercially available, for example, from Oriental Motor Corp., Tokyo, Japan.

The detecting unit 5 in this embodiment is a reflection-type photosensor comprising a light emitting diode 51 for irradiating the periphery of the yoke 123 from the rear side of the magnet assembly 12, and a photoreceptor 52 for receiving the reflected light from the yoke 123.

One half section of the yoke 123 has a smaller diameter than the rest as shown in FIG. 1. Therefore, the light from the light emitting diode 51 is not reflected during a first half period among one turn of the magnet assembly 12, and is reflected with the yoke 123 during the second half period to be received by the photoreceptor 52.

The detecting unit 5 detects independently the rotation speed of each magnet assembly 12. Since the light received by the photoreceptor 52 periodically changes, the rotation speed of each magnet assembly 12 can be detected from such period. The deviation of the rotation speeds between a pair of magnet assemblies 12 can be detected by comparing the results detected with a pair of detecting units 5.

The controller system 6 for controlling the rotation of each magnet assembly 12 based on the results detected with the detecting unit 5 will be explained. The controller system 6 comprises a pulse control driver 61 for transmitting pulse drive signals to each motor 42, a driver controller 62 for transmitting control signals to the pulse control driver 61, a programmable controller 63 for transmitting rotation parameters to the driver controller 62, and a clock oscillator 64 for supplying clock pulses to each pulse control driver 61.

The programmable controller 63 sets the rotation direction and rotation speed of each motor 42, and their deviations between a pair of magnet assemblies 12 (hereinafter "phase difference"). The programmable controller 63 has a memory means, such as ROM containing these parameters, or RAM for storing these parameters from an external input means on its input panel.

The driver controller 62 plays a main part in feedback control carried out by the controller system 6. The driver controller 62 transmits control signals to the pulse control driver 61 in response to the results detected by the detecting unit 5 and the rotation parameters from the programmable controller 63. The control signals from the central control unit for controlling the whole operation of the mechanism are also transmitted to the driver controller 62. The driver controller 62 has an input circuit for signals from the programmable controller 63, the detecting unit 5, and the central control unit (not shown in the figure); an output circuit for signals to the pulse control driver 61; a memory circuit for storing temporarily rotation parameters from the programmable controller 63; an arithmetic circuit for calculating the rotation speed of each magnet assembly 12 based on the signals from the detecting unit 5; and a decision circuit for determining the rotation condition based on the results from the arithmetic circuit.

The pulse control driver 61 rotates the motor 42 by means of a drive pulse sequence in response to a command from the driver controller 62. The pulse control driver 61 comprises a pulse sequence creation circuit for generating a pulse sequence for the rotation, and a distribution circuit for distributing the generated pulse sequence to each exciting coil of the stepping motor. Because the same clock pulse from the clock oscillator 64 is transmitted to each pulse control driver 61, each pulse control driver 61 synchronously supplies a pulse sequence to the motor 42.

Next, the operation of the controller system 6 will be explained. When the substrate 2 is placed between the magnetron cathodes 1, as shown in FIG. 1, the central control unit transmits drive signals to the driver controller 62 based on detection signals for the position from a sensor (not shown in the figure). The driver controller 62 has previously received the rotation direction and speed of each magnet assembly 12 and the phase difference parameter from the programmable controller 63. The driver controller 62 transmits control signals to the pulse control driver 61 according to these rotation parameters when receiving the drive signals from the central control unit.

The pulse control driver 61 performs the initial point determination of two magnet assembly 12. The pulse control driver 61 rotates the motor 42 at a constant speed and detects the time when the detecting unit 5 changes from "on" to "off" or vice versa, which comprises the reflective photosensor for detecting the rotating yoke 123. The initial point determination can be achieved by stopping the motor 42 when each detecting unit 5 changes from "on" to "off", or vice versa. The initial point determination makes the phase difference between a pair of magnet assemblies 12 become zero.

In the case of setting the phase difference at 180 degrees, the initial point determination of a pair of magnet assemblies is first achieved according to the procedure set forth above. Then, while fixing one of the magnet assemblies 12, other is rotated 180 degrees.

After the initial point determination, the pulse control driver 61 transmits a drive pulse sequence to the motor 42 in response to the control signals from the driver controller 62, in synchronism with the clock pulse from the clock oscillator 64. The motor 42 rotates at a rotation speed according to the period of the drive pulse sequence in a rotation direction determined according to the drive pulse sequence distribution.

When film deposition is completed, the motor 42 stops its rotation. This stop of the rotation may be performed by the completion of the receiving of a predetermined number of drive pulse sequences which are transmitted in response to the rotation time set by the programmable controller 63, or may be performed by the stoppage of transmission of the drive pulse sequence from the pulse control driver 61 in which the driver controller 62 transmits signals for stopping the drive to the pulse control driver 61 in response to the drive stopping signals from the central control unit.

Another method for setting the phase difference is as follows: When the initial point determination is completed for a pair of magnet assemblies 12 and one of them starts to rotate, the other magnetic assembly 12 is started later at the time corresponding to the phase difference.

In this embodiment, a pair of magnet assemblies 12 rotate at the same speed in the same direction. Such a rotation can be achieved by the above-mentioned programmable controller 63 which controls two motors so as to rotate at the same speed in opposite directions to each other. The programmable controller 63 transmits a pair of drive pulse sequences, which includes the same rotation speed but opposite directions to each other, to a pair of motors 42 through the driver controller 62 and the pulse control driver 61. As a result, these motors 42 rotate in the same direction along the axis 41 perpendicular to the substrate 2, while keeping the constant phase difference.

Such rotation with same direction and constant speed prevents the fluctuation of plasma on the both sides of the substrate 2, which is caused by mutual crossing of two plasma regions. The rotation with the same direction and a constant speed achieves stable magnetron discharge on both sides of the substrate 2, resulting in an improvement in the in-plane distribution of magnetic characteristics of the magnetic film.

Other sections in the system will be explained in reference to FIG. 1. The power source 3 connected to the magnetron cathode 1 may be a direct current power for applying a negative high voltage up to 1,500 V, or may be a radio frequency power for applying a radio frequency having a frequency of 13.56 MHz and an output power of approximately 2 kw to the magnetron cathode 1.

The substrate 2 is transferred on a carrier (not shown in the figure) having four fingers which are provided for holding the substrate 2 at its four circumferential edge points, as shown in United States Patent application entitled "In-line Film Deposition System", Ser. No. 08/606,038, filed on Feb. 22, 1996. The substrate 2 is transferred into and stopped at the right center of a pair of magnetron cathodes 1 for film deposition.

The substrate 2 connects to a bias power source (not shown in the figure) for applying a bias power to the substrate 2. In this embodiment, the bias power source applies a direct current power to the substrate 2 through the carrier and fingers. A radio frequency power for applying a radio frequency to the substrate 2 is also usable as the bias power source, in which a negative bias voltage is applied to the substrate by means of the interaction between the radio frequency and the plasma.

The gas inlet system (not shown in the figure) comprises a gas cylinder for holding a sputtering gas, e.g., argon gas, a pipe for connecting the gas cylinder with the vacuum chamber, and a conductance valve provided on the pipe. The gas inlet system introduces the sputtering gas, for example, argon gas, into the space between the magnetron cathodes 1 and the substrate 2.

The vacuum chamber is provided with a gas inlet nozzle so as to face the space between the substrate 2 and the magnetron cathodes 1. The gas inlet nozzle connects to the pipe which airtightly bores through the wall of the vacuum chamber.

Then, the sputtering method will be explained based on the operation of the sputtering mechanism set forth above in accordance with this embodiment.

A carrier (not shown in the figure) transfers the substrate 2 into the right center between a pair of magnetron cathodes 1 through a gate valve provided on the wall of the vacuum chamber. When the carrier with the substrate 2 stops, a sputtering gas, e.g., argon gas, is introduced by means of the action of the gas inlet system. At the same time, a pair of magnet assemblies 12 rotate in the same direction and at the same speed, as set forth above.

By means of the operation of the power source 3, an electric power is applied to magnetron cathodes 1 to generate magnetron discharge. The magnetron discharge sputters the targets 11 to generate target particles. The sputtered target particles travel and are deposited on the substrate as a thin film.

According to the sputtering mechanism and sputtering method of the embodiment set forth above, the uniformity of the magnetic characteristics of the magnetic film deposited are significantly improved compared with any conventional method.

Figure 3:
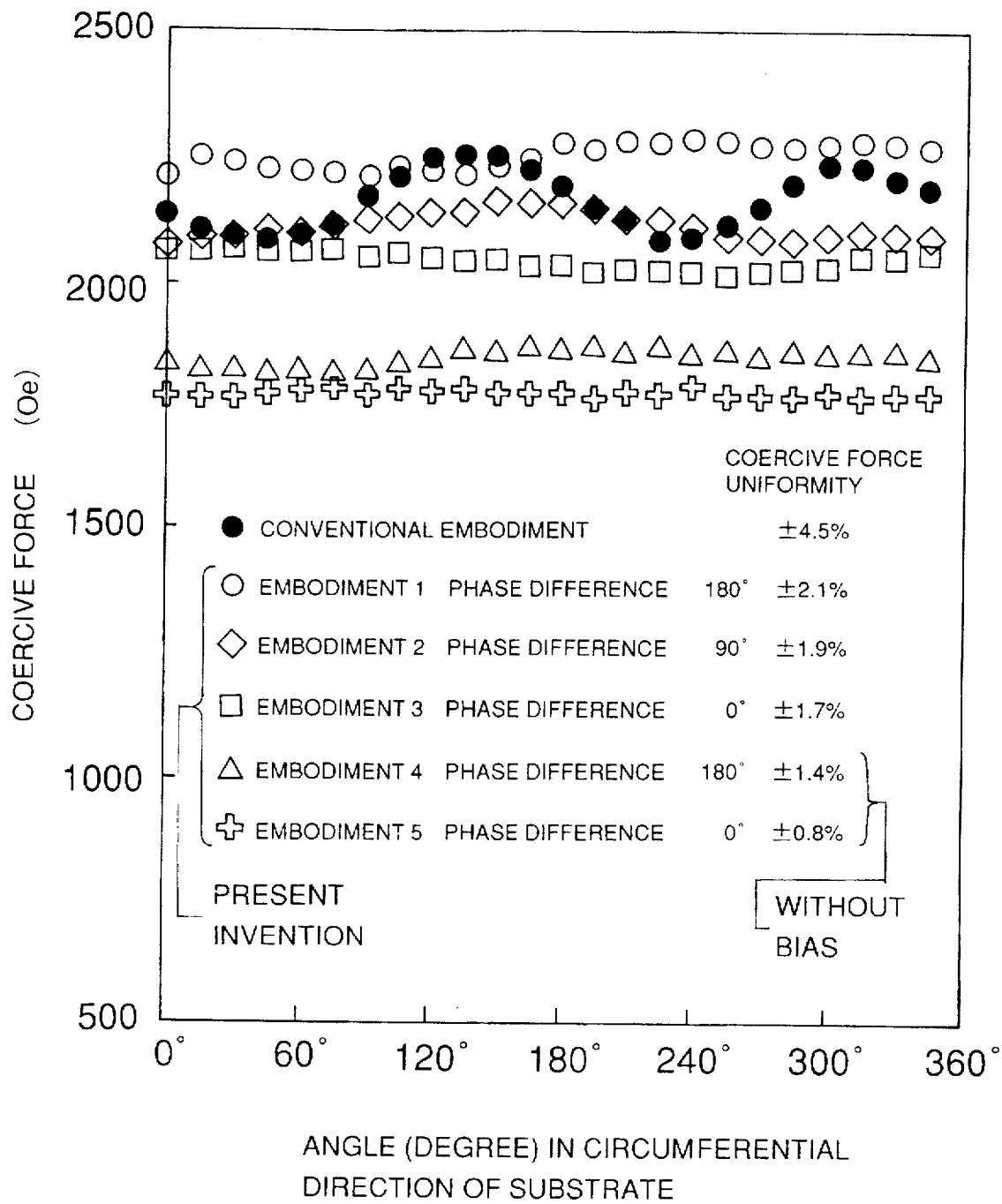
FIG. 3 is a graph illustrating the distribution of the coercive force in the circumferential direction of the substrate.
Figure 4A:
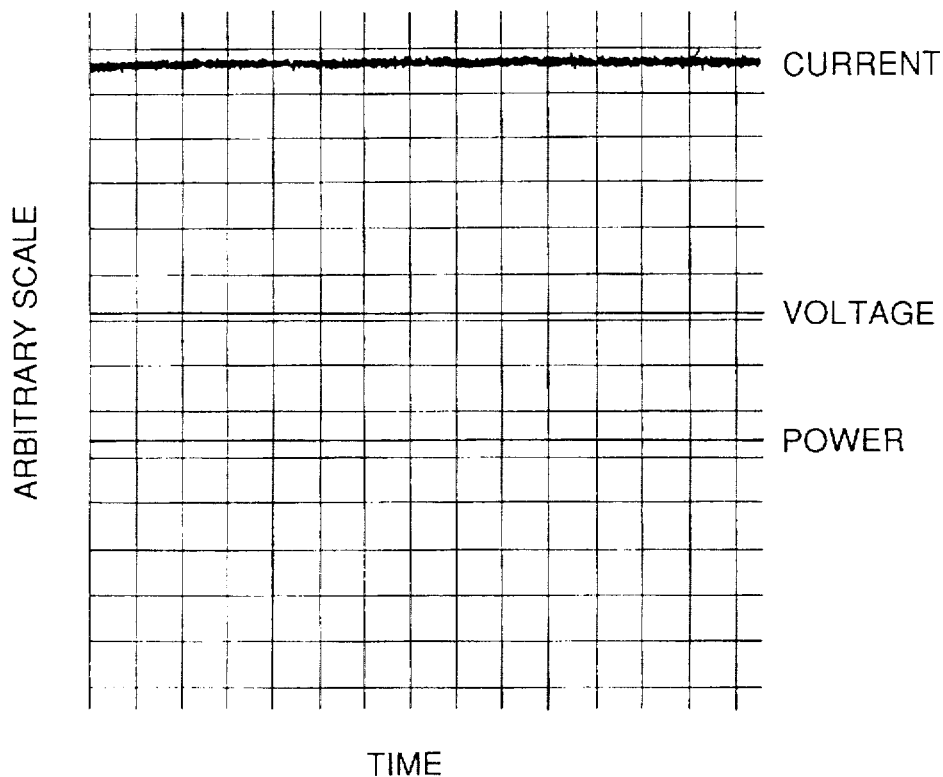
FIGS. 4(a) and 4(b) are graphs representing the current and power fluctuations during film deposition under a constant bias power in accordance with the present embodiment and the conventional method and mechanism.
Figure 5:
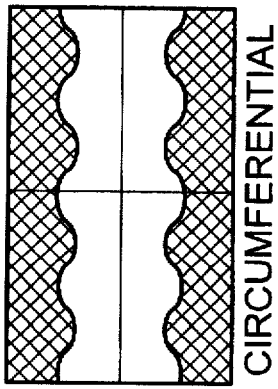
FIG. 5 is a table for the comparison of modulation characteristics of hard disks in accordance with this embodiment and the conventional method and mechanism.
Figure 5:
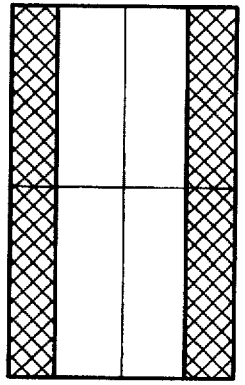

FIGS. 3, 4(a), and 5 show the magnetic characteristics of the magnetic film deposited with the sputtering mechanism and sputtering method in accordance with the embodiment shown in FIG. 1. FIG. 3 is a graph illustrating the distribution of the coercive force in the circumferential direction of the substrate. FIG. 4(a) is a graph representing the current and power fluctuations during film deposition under a constant bias power. FIG. 5 is a table for the comparison of modulation characteristics of hard disks made by the mechanism and method shown in FIG. 1 and made by a conventional mechanism and method.

In the recording media, the thickness of the underlying film and magnetic thin film deposited on the substrate 2 has become thinner in response to a demand for higher recording densities. At the same time, technical requirements have become more strict, for example, a higher coercive force and more uniform circumferential coercive force of the magnetic recording layer, as well as a reduction in noise during reading out signals are required. The present inventors have found that such demands on the coercive force cannot be achieved by any conventional mechanism and method for high density recordings of 850 Mbit/in.$^2$ or more. They have overcome such technical limitations by means of the same directional rotation of a pair of magnet assemblies 12.

The present inventors presumed that the cause of the limitation of the uniform in-plane magnetic characteristics is that both plasma regions may cross each other due to the rotation of magnet assemblies 12. In conventional mechanisms and methods, a pair of opposing magnet assemblies 12 rotate in opposite directions to each other. Thus, the opposite rotations of magnet assemblies cause the plasma regions generated at both sides of the substrate 2 to cross each other.

As shown in FIG. 10(b), when a pair of magnet assemblies 12 rotates in opposite directions to each other, plasma regions 80 and 81 generated by their respective magnet assemblies 12 cross each other. Such mutual crossing of plasma regions will cause unstable fluctuation of plasma density and a drifting of charged particles in both plasma regions. Such mutual crossing of plasma regions causes the nonuniform coercive force. Particularly, when a bias power is applied to the substrate 2, the mutual crossing of plasma regions causes the amount of ions induced by the bias power to unstably vary, so the nonuniform magnetic characteristics would be further enhanced.

The present inventors set a pair of magnet assemblies 12 at the same rotation speed in the same direction in order to prevent the mutual crossing of plasma regions set forth above. FIG. 3 is a graph showing the experimental results.

In FIG. 3, the horizontal axis represents an angle in the circumferential direction of the substrate, and the vertical axis represent its respective coercive force at the angle. A conventional method (depicted with●) shows that a circumferential fluctuation of coercive force is approximately ±4.56%. In contrast, the embodiment of the present invention shows a uniform circumferential coercive force, for example, a fluctuation of ±0.8% at no phase difference. Further, at a phase difference of 180 degrees, a high coercive force of 2,200 to 2,300 Oe can be obtained with a fluctuation of ±2.1%.

In FIG. 3, the bias voltage is set to −300 V for the conventional method and the embodiments of the present invention 1 to 3, and 0 V for the embodiments of the present invention 4 and 5. As shown in these results, a bias power applied to the substrate increases the coercive force.

As described above, the rotations of a pair of magnet assemblies 12 at the same speed in the same direction prevent the mutual crossing of plasma regions, and thus the magnetic characteristics of the deposited magnetic film become uniform.

Figure 4B:
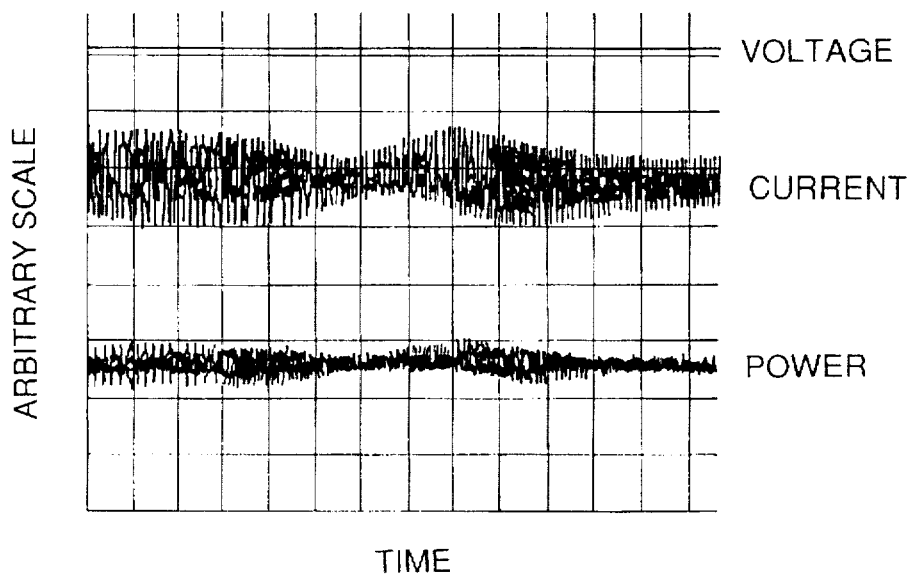

The fluctuations of current and power passing through the substrate 2 were monitored while applying a bias power to the substrate during a deposition process for clarifying the cause of the uniform magnetic characteristics, as shown FIG. 4. FIG. 4(a) is a graph illustrating the fluctuation of the current and power in the mechanism and method in accordance with this embodiment, and FIG. 4(b) is a graph illustrating the fluctuation of the current and power in the mechanism and method based on the conventional method. A direct current bias voltage of approximately −300 V was applied to the substrate in both embodiments. The phase difference is set to 180 degrees in this embodiment shown in FIG. 4(a).

In the conventional method, the current passing through the substrate 2, and thus the power, drastically fluctuate as shown in FIG. 4(b), whereas in the embodiment of the present invention these are stable, as shown in FIG. 4(a).

In the conventional method in which a pair of magnet assemblies 12 rotate in opposite directions to each other, mutual crossing of plasma regions caused by such rotations significantly varies the plasma density and the drift of charged particles between magnetron cathodes. In contrast, in the embodiment of the present invention in which a pair of magnet assemblies 12 rotate at the same speed in the same direction, since the above-mentioned plasma behavior is not observed, the plasma density and the drift will be extremely stable.

The modulation characteristics of hard disks made by the mechanisms and methods in accordance with the embodiment of the present invention and the conventional method were measured. FIG. 5 is a table illustrating the circumferential coercive force fluctuation and the modulation characteristic of each method. The modulation characteristic or circumferential power distribution drastically vary in the hard disk made by the conventional mechanism and method. These characteristics vary little in the mechanism and method in accordance with the present embodiment. Thus, the mechanism and method of the present embodiment, in which rotation at the same speed and in the same direction is carried out, enables production of a hard disk having excellent modulation characteristics.

Figure 9:
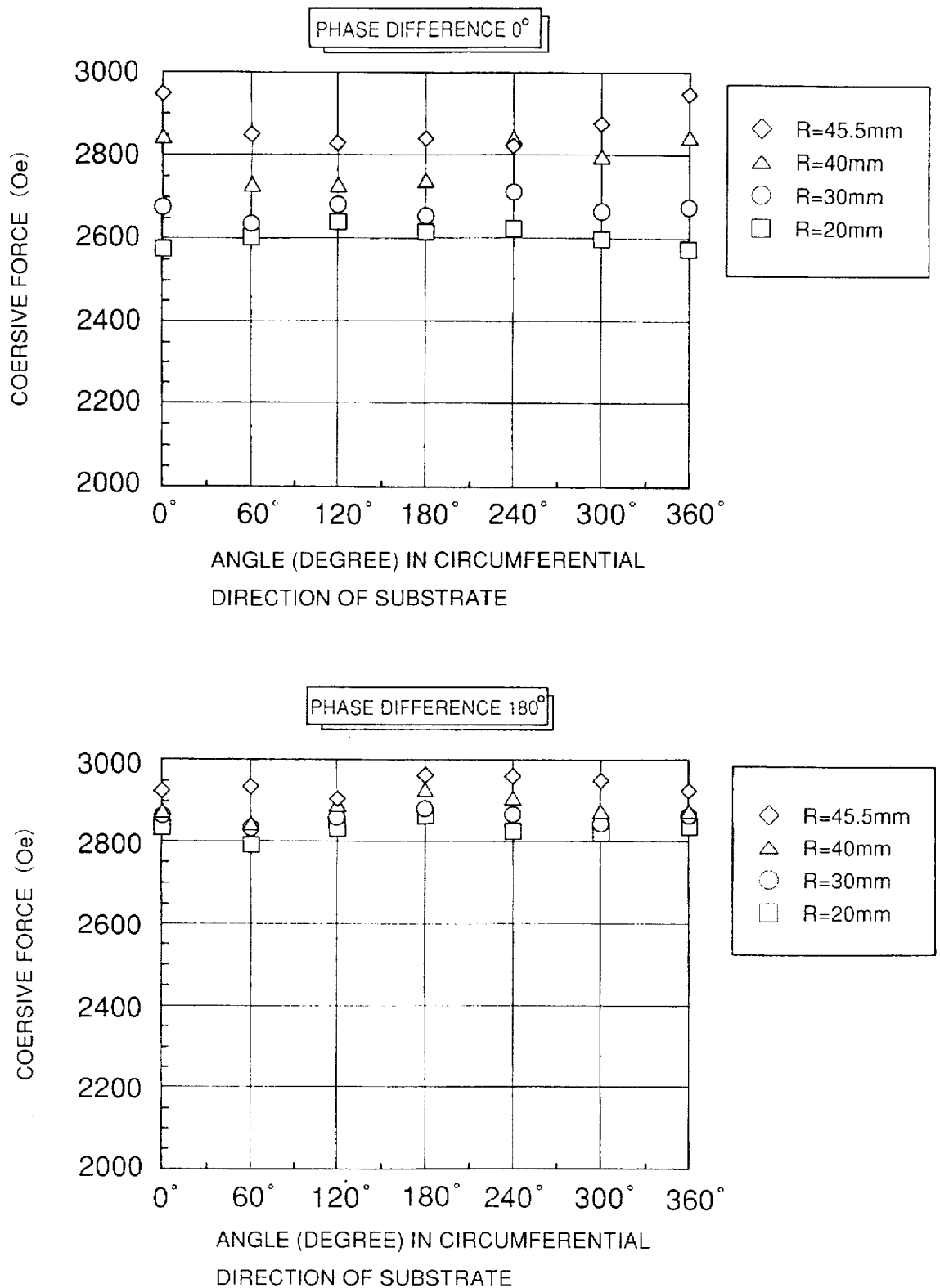
FIG. 9 shows graphs illustrating the dependence of the coercive force on the phase difference.

FIG. 9 includes graphs illustrating the dependence of the coercive force of the magnetic film on the phase difference. Coercive forces of a 20-nm thick CoCrTa film, which was deposited on an aluminum substrate for a hard disk in accordance with the mechanism and method of this embodiment, were measured with phase differences of 0 degrees and 180 degrees at the distances of 45.5 (◇), 40 (△), 30 (○), and 20 (□) mm. FIG. 9 demonstrates that the radial coercive force is almost constant at the phase difference of 180 degrees, compared with at the phase difference of 0 degree. Thus, the phase difference of 180 degree is effective to achieve uniform radial coercive force. In addition, the circumferential coercive force is almost constant, too, at the phase difference of 180 degrees. Accordingly, the coercive force distribution in the radial direction becomes uniform by adjusting the phase difference of the magnet assemblies 12.

Some modifications for further enhancing the effects set forth above will be explained in this embodiment.

Drive pulse sequences in two motors 42 are synchronized with each other by using the common clock pulse from one clock pulse oscillator 64 to rotate a pair of magnet assemblies 12 at the same speed and in the same direction in the present embodiment. The use of one clock pulse oscillator 64 is effective to achieve the rotations of a pair of magnet assemblies 12 at the same speed.

Slight difference of the clock pulse is, however, unavoidable due to the clock frequency difference or the temperature drift even when a highly precise clock oscillator is used. The clock frequency difference or clock pulse difference gradually varies the rotation speeds of two motors 42 and thus varies the phase difference during rotation, as shown in FIG. 10(a). Such phase difference variation during rotation is promoted when the rotation speed increases or the deposition time is prolonged. The worst will be that the phase difference variation during rotation causes the mutual crossing of plasma regions 80 and 81 generated by their respective magnet assemblies 12, as shown in FIG. 10(a). Such phase difference variation may cause a nonuniform circumferential coercive force even if the motors rotate in the same direction.

In this embodiment, the rotation speeds of a pair of magnet assemblies 12 are detected with the detecting unit 5 for the feedback control in which the variations in the rotation speed and the phase difference are corrected.

Results from the detecting unit 5, i.e., the on-off signals, are feedbacked to the driver controller 62. On-off signals from the detecting unit 5 are operated in the arithmetic circuit in the driver controller 62 so as to determine the rotation speeds of a pair of magnet assemblies 12. The determined rotation speeds are transmitted to the decision circuit.

On the other hand, the signals on the rotation speed determined in the programmable controller 63 are transmitted to the pulse control driver 61. These signals have been previously transmitted to the decision circuit. The decision circuit is composed of OP amplifier ICs and generates control signals so that the difference between the predetermined and calculated rotation speeds becomes zero. The control signals control signals concerning the rotation speed to be transmitted to the pulse control driver 61. The pulse control driver 61 changes the drive pulse sequence to be transmitted to the motors 42 so that the predetermined rotation speed is maintained. Such negative feedback control can maintain the constant rotation speed of the motors 42 with a high precision.

The control mechanism in this embodiment also uses signals from the detecting unit 5 for detecting the rotations of magnet assemblies 12, when the stepping motors are subjected to closed-loop control. Since the stepping motor rotates by a constant angle every one pulse, the closed-loop control is effective. In general, the stepping motor requires a rotation detecting system of a rotary encoder for the closed-loop control. However, in this embodiment, the detecting unit 5 acts as an encoder. Thus, the control system in this embodiment can be simplified with low cost.

Such a rotation system can also be controlled by detecting the phase difference of each magnet assembly 12, not the rotation speed.

The phase difference variation between a pair of magnet assemblies 12 is converted to the variation of on-off signals which are transmitted from two detecting units 5 each comprising the reflective photo sensor. The variation of on-off signals is reduced to the phase difference variation by the circuit in the driver controller in order to transmit the phase difference variation to the decision circuit. On the other hand, setting phase difference signals have been previously input from the programmable controller 63. The decision circuit compares the detected phase difference with the setting phase difference, and generates control signals to compensate for the difference between them to become zero.

The control signals control signals of the rotation speed to be transmitted to the pulse control driver 61 so as to maintain the setting phase difference. In detail, the rotation speed of one motor 42 is fixed and the rotation speed of the other motor 42 is temporarily modified.

Figure 6:
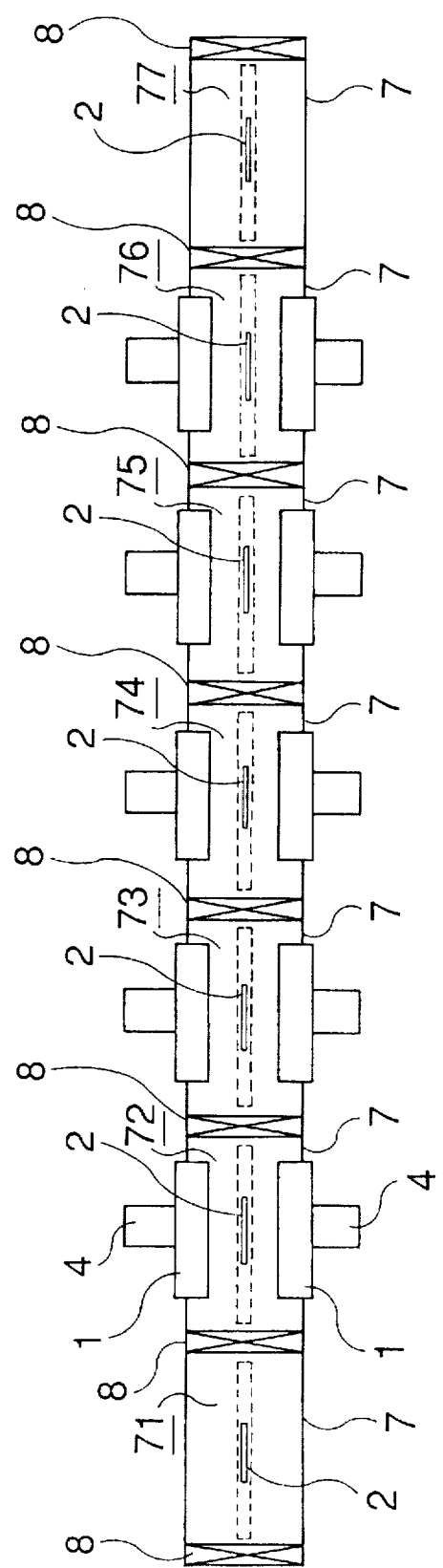
FIG. 6 is an outlined view illustrating an in-line sputtering apparatus in which the sputtering mechanism in accordance with the present invention is installed.

FIG. 6 is a plan view illustrating the overall outline of an in-line sputtering system. The in-line sputtering apparatus is provided with a plurality of vacuum chambers 7, between which gate valves 8 are provided, along the transferring route of the substrate in a straight line. The in-line sputtering system is suitable for obtaining high quality multi-layer stacked films because the deposition method can be achieved without exposing the substrate 2 to the atmosphere.

The vacuum chambers 7 comprise a load chamber 71, a first deposition chamber 72, a second deposition chamber 73, a third deposition chamber 74, a fourth deposition chamber 75, a fifth deposition chamber 76, and an unload chamber 77 in the transferring order. Each deposition chamber 72, 73, 74, 75 or 76 has a pair of sputtering mechanisms in this embodiment so that the substrate 2 is placed between the sputtering mechanisms when the substrate is stopped.

Magnetic recording media such as hard disks generally have multi-layer stacked structures. Such multi-layer stacked structures, for example, an underlying film and a magnetic film, are deposited in these chambers 7 in the transferring order. The vacuum chambers 7 may have a pretreatment chamber for removing the intrinsic oxide or water on the surface of the substrate 2 by radio frequency etching, and/or a heating chamber for preliminarily heating the substrate in order to improve the deposition efficiency, before the deposition chambers. The vacuum chambers 7 also may have a post-treatment chamber for depositing a carbon protective film on the multi-layer stacked film after the deposition chambers.

The sputtering mechanism in accordance with the present invention can be installed in the sputtering systems described in the above-mentioned United States Patent application entitled "In-line Film Deposition System", Ser. No. 08/606,038, the subject matter of which is hereby incorporated herein by reference. Further, this sputtering mechanism can be installed in the in-line sputtering system, "ANELVA-3100" having four pairs of magnetron cathodes in one deposition chamber.

Figure 7:
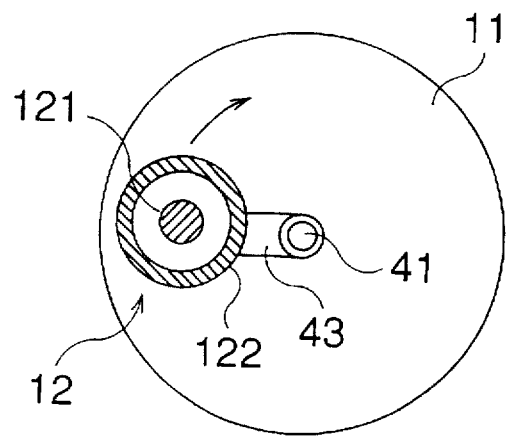
FIGS. 7(a), 7(b) and 7(c) are plan views illustrating other magnetic assemblies in accordance with the present embodiment.
Figure 7:
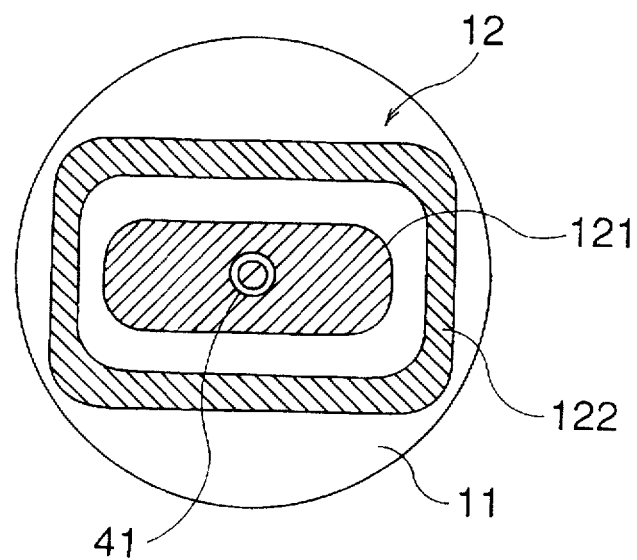
Figure 7:
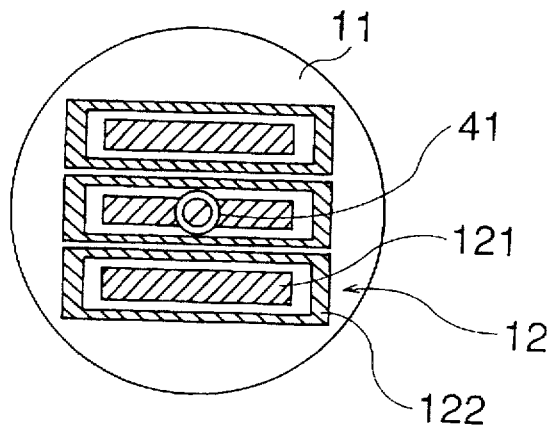

Other magnet assemblies are shown in FIGS. 7(a), 7(b) and 7(c). As described above, magnets provided to magnetron cathodes establish a magnetic field having an asymmetric distribution to the rotation axis perpendicular to the substrate. Such asymmetric distribution, as well as the rotation of magnet assemblies set forth above, contributes to the uniform erosion and extended erosion area of the target 11. Arrangements of magnet assemblies 12 other than that shown in FIG. 1 are conceivable to achieve the asymmetric magnetic field to the rotation axis 41.

Figure 8:
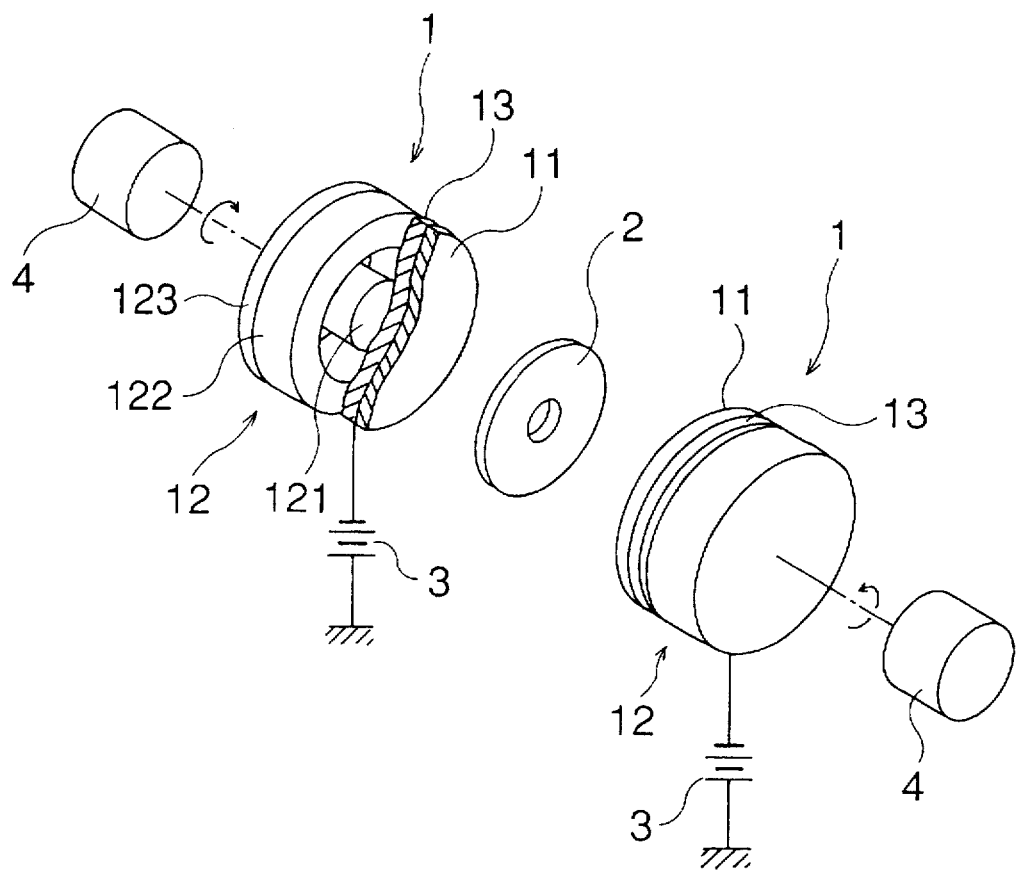
FIG. 8 is an outlined perspective view illustrating a prior art double-sided sputtering mechanism.

In FIG. 7(a), although each magnet assembly 12 comprises a cylindrical central magnet 121 and a circular peripheral magnet 122 similar to the conventional magnet assemblies shown in FIG. 8, its center significantly deviates from the center of the rotation axis. In FIG. 7(b), the magnet assembly comprises a long rectangular central magnet 121 and a hollow rectangular peripheral magnet 122. Further, in FIG. 7(c), the magnet assembly comprises three sets of combinations of a long rectangular central magnet 121 and a hollow rectangular peripheral magnet 122.

Several pairs of magnetron cathodes 1 may also be provided so that the substrate 2 is surrounded instead of the pair of magnetron cathodes 1 as in the above-described embodiment. In this case, the pair of magnetic assemblies, which is provided for each pair of magnetron cathodes, rotates at the same speed and in the same direction perpendicular to the substrate 2.

In addition, a plurality of substrates 2 may be held in the same plane of the substrate holder, at both sides of which several pairs of magnetron cathodes are provided in a vacuum chamber, differing from the above-mentioned embodiment in which only one substrate is placed in the vacuum chamber.

Instead of the stepping motor set forth above, direct current motors, alternate current motors, direct or alternate current servo motors, and other motors may be used according to demand. When servo motors are used, although the servo unit of the motor can be used, the servo system can also be achieved by using signals on the rotation of each magnet assembly 12 from the detecting unit 5 similar to the stepping motor set forth above.

Even if the controller system 6 is not provided, the effect of the present invention will be satisfactorily achieved by detecting the rotation speed of each magnet assembly 12 using only the detecting unit 5.

The deposition method can be carried out while the substrate 2 moves between at least one pair of magnetron cathodes 1, other than the above-mentioned embodiment in which the substrate stands still during the deposition method.

Examples of preferable substrates 2 for the magnetic recording media may include aluminum substrates, carbon substrates, glass substrates, and silicon substrates.

The film deposition method in accordance with the present invention is also applicable to any film deposition method other than magnetic thin films. The film deposition method in accordance with the present invention not causing the mutual crossing of plasma regions can form films having a uniform quality and thickness. In magnetic recording media, chromium or chromium alloy films are preferably deposited as underlying films. When the deposition method in accordance with the present invention is applied to such a film deposition method, characteristics of the magnetic recording media are further improved.

As described above, since a pair of magnet assemblies opposing each other rotate at the same speed in the same direction according to the method of the present invention, the mutual crossing of plasma regions can be avoided. Therefore, a magnetic thin film having uniform magnetic characteristics, and in particular, coercive force in the circumferential direction of the substrate, can be deposited.

Further, a magnetic thin film having uniform magnetic characteristics, and in particular, coercive force in the radial direction of the substrate, can be deposited by adjusting the phase difference between a pair of the magnet assemblies.

Since the variation of the rotation speed and the shift of the phase difference of each magnetic assembly is compensated for while monitoring the rotation speed and/or the phase difference in the mechanism in accordance with the present invention, the phase difference keeps constant during rotation. Therefore, the sputtering mechanism in accordance with the present invention enables the method in accordance with the present invention to achieve.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A sputtering method of depositing a magnetic thin film on both surfaces of a substrate by magnetron sputtering, comprising the steps of:

establishing a magnetic field asymmetric to a rotation axis perpendicular to the substrate over a target with a pair of magnetic assemblies of magnetron cathodes that oppose each other; and rotating the pair of magnetic assemblies of magnetron cathodes at the same speed and in the same direction.

2. A sputtering method according to claim 1, wherein a bias power is applied to the substrate during deposition.

3. A sputtering method according to either of claim 1, wherein the rotation speed of each magnet assembly is controlled while detecting the rotation speed and/or the phase difference of each magnet assembly.

4. A sputtering method of depositing a magnetic thin film on both surfaces of a substrate by magnetron sputtering, comprising the steps of:

establishing a magnetic field asymmetric to a rotation axis perpendicular to the substrate over a target with a pair of magnetic assemblies of magnetron cathodes that oppose each other;

setting a phase difference of the pair of magnetic assemblies of magnetron cathodes so that a coercive force of the magnetic thin film is uniform in a radial direction of the substrate; and rotating the pair of magnetic assemblies of magnetron cathodes at the same speed and in the same direction.

5. A sputtering method according to claim 2, wherein the phase difference between the magnetic assemblies is set to 180 degrees.

6. A sputtering method according to claim 2, wherein a bias power is applied to the substrate during deposition.

7. A sputtering method according to claim 2, wherein the rotation speed of each magnet assembly is controlled while detecting the rotation speed and/or the phase difference of each magnet assembly.

8. A sputtering mechanism for depositing a magnetic thin film on both surfaces of a substrate by magnetron sputtering, comprising:

a pair of magnetic assemblies of magnetron cathodes that oppose each other;

a rotation drive unit for rotating each of the magnetic assemblies; and a common means for controlling the rotation drive units.

9. A sputtering mechanism according to claim 8, wherein the controller means comprises a pulse control driver for transmitting pulse drive signals to each rotation drive unit, a programmable controller for transmitting control signals to the pulse control driver, and a clock oscillating circuit for supplying clock pulses to each pulse control driver.

10. A sputtering mechanism according to claim 8, wherein the controller means further comprises a detecting unit for independently detecting the rotation speed and the phase difference of each magnet assembly.

11. A sputtering mechanism according to claim 8, wherein the rotation drive system is a servo motor or a stepping motor.

* * * * *